(12) United States Patent
Lee

(10) Patent No.: US 6,455,366 B1
(45) Date of Patent: Sep. 24, 2002

(54) METHOD OF FORMING A JUNCTION REGION IN A SEMICONDUCTOR DEVICE

(75) Inventor: Jung Ho Lee, Seoul (KR)

(73) Assignee: Hyundai Electronics Industries Co., Ltd., Kyungki-Do (KR)

( * ) Notice: Subject to any disclaimer, the term of this patent is extended or adjusted under 35 U.S.C. 154(b) by 0 days.

(21) Appl. No.: 09/468,883

(22) Filed: Dec. 22, 1999

(30) Foreign Application Priority Data

Dec. 30, 1998 (KR) .............................. 98-61432

(51) Int. Cl.⁷ .......................................... H01L 21/8239
(52) U.S. Cl. ........................................ 438/241; 438/300
(58) Field of Search ................................ 438/142, 143, 438/265, 279, 300, 303, 241, FOR 212, FOR 162

(56) References Cited

U.S. PATENT DOCUMENTS

| | | | | |
|---|---|---|---|---|
| 4,797,372 A | * | 1/1989 | Verret et al. | 437/34 |
| 4,952,524 A | * | 8/1990 | Lee et al. | 437/67 |
| 5,084,416 A | * | 1/1992 | Ozaki et al. | 437/190 |
| 5,536,684 A | | 7/1996 | Dass et al. | |
| 5,631,189 A | * | 5/1997 | Kobayashi et al. | 438/448 |
| 5,665,633 A | * | 9/1997 | Meyer | 438/437 |
| 5,773,350 A | | 6/1998 | Herbert et al. | |
| 5,841,169 A | | 11/1998 | Beasom | |
| 5,953,605 A | * | 9/1999 | Kodama | 438/231 |
| 5,970,351 A | * | 10/1999 | Takeuchi | 438/300 |
| 6,010,936 A | * | 1/2000 | Son | 438/303 |
| 6,027,959 A | * | 2/2000 | En et al. | 438/142 |
| 6,090,645 A | * | 7/2000 | Hamada | 438/143 |
| 6,248,629 B1 | * | 6/2001 | Liu et al. | 438/258 |

FOREIGN PATENT DOCUMENTS

| | | | | |
|---|---|---|---|---|
| JP | 61-89669 | | 5/1986 | |
| JP | 61-296754 | | 12/1986 | |
| JP | 1-293668 | | 11/1989 | |
| JP | 1-302838 | | 12/1989 | |
| JP | 11-135740 | * | 5/1999 | 27/108 |

* cited by examiner

Primary Examiner—George Fourson
Assistant Examiner—Suk San Foong
(74) Attorney, Agent, or Firm—Pennie & Edmonds LLP

(57) ABSTRACT

The present invention relates to a method of forming a junction region in a semiconductor device by which a doped epi-silicon layer is used to form a source/drain junction at a cell area, in applying an elevated source/drain junction using a selective epitaxial technology to the device as the integration degree of the semiconductor device increases; and ion implantation process and thermal process are performed to form a source/drain junction at a peripheral circuit area with a nitride film being capped. Thus, as the elevated source/drain junction is applied, a contact margin can be obtained and also a contact resistance can be reduced, at the cell area, due to flattened gate during a subsequent process of forming a contact. Also, as the ion implantation process and the thermal processing process are performed with the nitride film being capped, the effects of diffusing dopants can be prevented and also a source/drain junction having a relatively low depth of junction can be formed, at the peripheral circuit area. Further, metal contamination that could occur upon implantation of ions can be prevented at it. As a result, the present invention can improve the characteristic of the junction at each of the cell area and the peripheral circuit area.

13 Claims, 2 Drawing Sheets

METHOD OF FORMING A JUNCTION REGION IN A SEMICONDUCTOR DEVICE

BACKGROUND OF THE INVENTION

1. Field of the Invention

The invention relates generally to a method of forming a junction region in a semiconductor device. More particularly, the present invention relates to a method of forming a junction region in a semiconductor device by which, when applying an elevated source/drain junction using a selective epitaxial technology to the device as the integration degree of the semiconductor device increases, the elevated source/drain junction is applied only to the cell area; and source/drain ion implantation process and thermal process are performed with a nitride film being capped at the peripheral area, thus resulting in an improved characteristic of the device junction both at the source/drain regions and an improved characteristic of transistors in the semiconductor device.

2. Description of the Prior Art

Generally, as the integration degree of the semiconductor device increases, during a subsequent process of forming a contact, a known epitaxial technology is used to apply the elevated source/drain junction to the device so as to improve the contact resistance while securing a contact margin.

FIGS. 1a through 1d show sectional views of a device for illustrating a conventional method of forming a junction in a semiconductor device. The method of forming a junction shown by reference to FIGS. 1a through 1c can be applied to both the cell region and peripheral circuit regions, and FIG. 1d shows an enlarged view of the junction formed at the peripheral circuit region.

Referring now to FIG. 1a, a device separation film 12 is formed on a semiconductor substrate 11 to define an active region. Then, after a gate oxide film 13, a conductive layer for gate electrode 14 and a mask insulation film 15 are sequentially formed, a gate electrode 14 is formed on the semiconductor substrate 11 in the active region through etching process using a gate mask.

Next, as shown in FIG. 1b, after a gate spacer 16 is formed at the side wall of a pattern in which the gate oxide film 13, the gate electrode 14 and the mask insulation film 15 are stacked, an undoped epitaxial silicon layer 17 is selectively formed on it using chemical vapor deposition (CVD) method.

Thereafter, referring to FIG. 1c, after source/drain ion implantation process is performed, a thermal process for activating ion-implanted dopant is performed to make the dopants a little diffuse into the semiconductor substrate 11, thus forming a elevated source/drain junction 18.

However, the method of forming an elevated source/drain junction using a conventional selective epitaxial technology is to grow an undoped silicon layer using epitaxial technology and then to control the energy of ion implanted and the amount of implanted ions to form a junction. Then, as the source/drain junction in the peripheral area requires relatively a higher rate of source/drain concentration compared to that of the cell area, severe requirements for ion implantation conditions has to be set. Under these conditions, upon ion implantation, it makes the apparatus vulnerable to metal contamination. As well known in the art, also due to facet inevitably occurring upon a selective epitaxial formation, it degenerates the phenomenon by which the undoped silicon layer is deeply formed toward the portion in which the channel is formed, as shown in FIG. 1d. Thus, it is well known that it is a factor which generally degrades the transistor characteristic in the peripheral circuit area.

SUMMARY OF THE INVENTION

It is therefore an object of the present invention to provide a method of forming a junction in a semiconductor device by which, when applying an elevated source/drain junction using a selective epitaxial technology to the device as the integration degree of the semiconductor device increases, the elevated source/drain junction is applied only to the cell area and source/drain ion implantation process and thermal process are performed with a nitride film being capped at the peripheral circuit area, thereby making metal contamination low and thus lowering diffusion of dopants that is suppressed under a high compressive stress so that the junction depth can be reduced and the characteristic of the device junction at both areas can be improved.

In order to accomplish the above object, the method of forming a junction region in a semiconductor device according to the present invention is characterized in that it comprises the steps of forming gate electrodes at a cell area and a peripheral circuit area, respectively, which are defined in a semiconductor substrate; forming gate spacers at side walls of each of the gate electrodes and forming a nitride film only at said peripheral circuit area; selectively forming a doped epitaxial silicon layer on said semiconductor substrate in the cell area; performing source/drain implantation process to the peripheral circuit area covered with the nitride film and then performing thermal process for activating ion implanted dopants to forming a source/drain junction only at the peripheral circuit area, so that, during the thermal processing process, the dopants within said doped epitaxial silicon layer are diffused to form an elevated source/drain junction at the cell area; and removing any nitride film remaining at said peripheral circuit area to form an interlayer insulation film.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

Figure 1A:
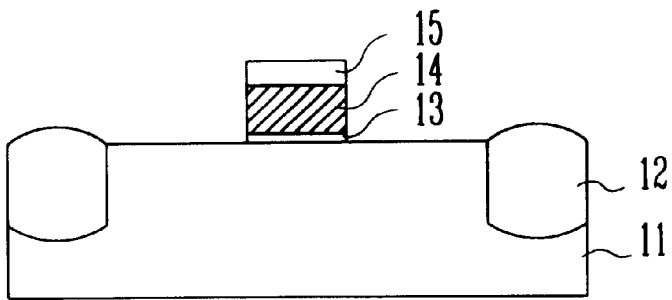
FIGS. 1a through 1d show sectional views of a device for illustrating a conventional method of forming a junction in a semiconductor device.
Figure 1B:
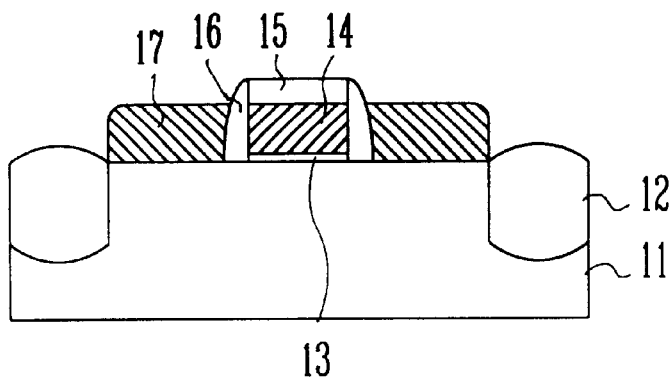
Figure 1C:
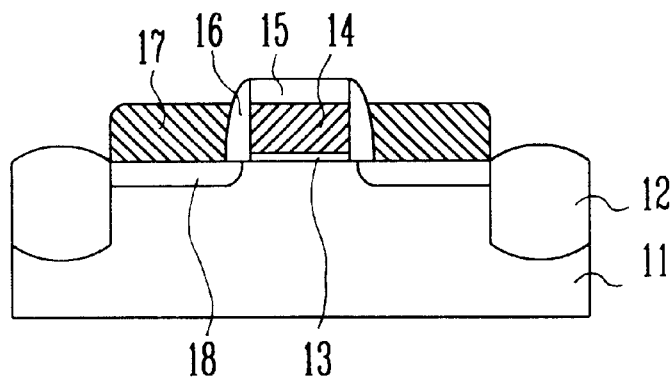
Figure 1D:
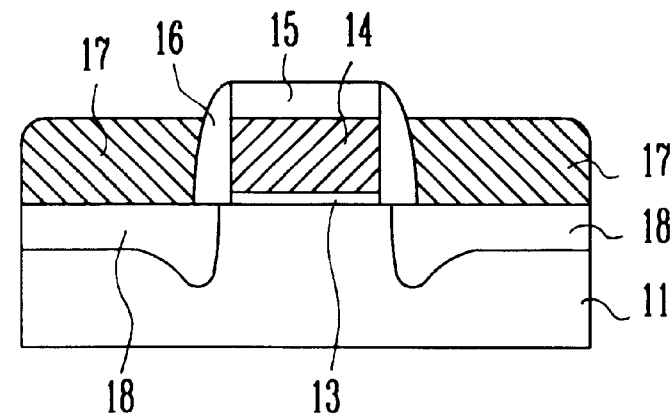

The present invention will be described in detail by way of a preferred embodiment with reference to accompanying drawings, in which like reference numerals are used to identify the same or similar parts.

FIGS. 2a through 2e show sectional views of a device for illustrating a method of forming a junction in a semiconductor device according to one embodiment of the present invention.

Figure 2A:
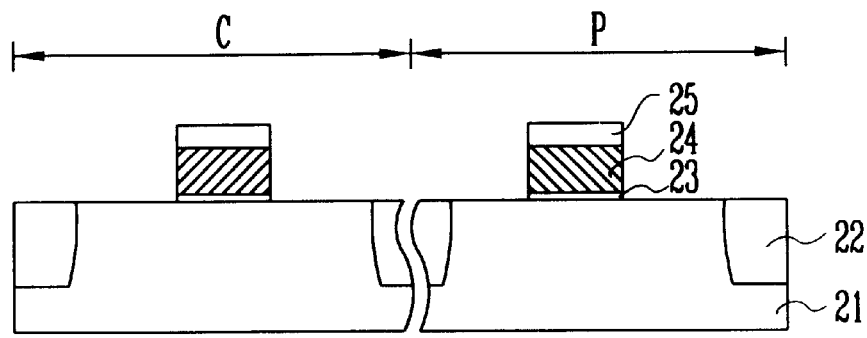
FIGS. 2a through 2e show sectional views of a device for illustrating a method of forming a junction in a semiconductor device according to one embodiment of the present invention.

Referring now to FIG. 2a, a device separation film 22 is formed on a semiconductor substrate 21 into which a cell area C and peripheral circuit area P are divided, thus defining an active region. Then, after a gate oxide film 23, a conductive layer for gate electrode 24 and a mask insulation film 25 are sequentially formed, a gate electrode 24 is formed on the semiconductor substrate 21 in the active region at each of the cell area C and the peripheral circuit area P through etching process using a gate mask.

Figure 2B:
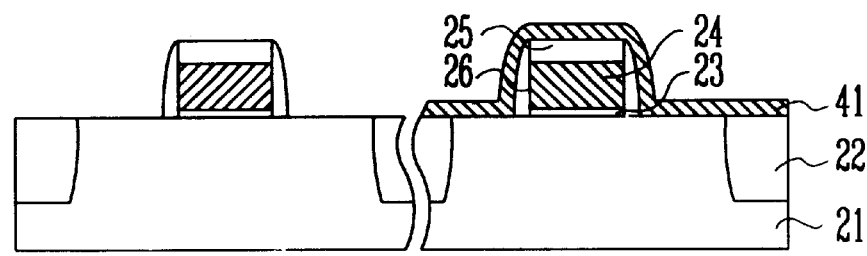

Next, as shown in FIG. 2b, after a gate spacer 26 is formed at the side wall of a pattern in which the gate oxide film 23, the gate electrode 24 and the mask insulation film 25 are stacked to form a nitride film 41 on the entire structure. Then, the nitride film 41 at the cell area C is removed, thus remaining the nitride film 41 only at the peripheral circuit area P.

In the above, in order for the gate spacer 26 not to be affected when removing the nitride film 41 remaining at the peripheral circuit areas P, it is formed with oxide film having a high rate of selective etching to the nitride film 41 and having the range of 300~800 Å in thickness. The nitride film 41 is deposited in thickness of 300~800 Å using low pressure chemical vapor deposition (LPCVD).

Figure 2C:
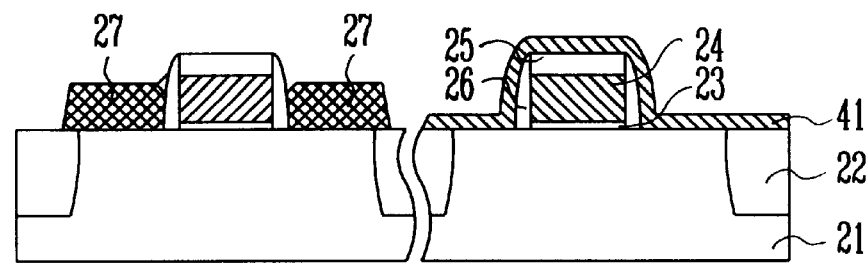

Next, referring to FIG. 2c, a doped epitaxial silicon layer 27 is formed on the semiconductor substrate 21 in the cell area C.

In the above, the doped epitaxial silicon layer 27 is formed in thickness of 500~800 Å. At this time, before the doped epitaxial silicon layer 27 is formed, cleaning process for removing oxide film etc. which are generated at the surface of the semiconductor substrate 21. The cleaning for the semiconductor substrate 21 can be performed using RCA cleaning, UV ozone cleaning, HF dipping or combination of these. The doped epitaxial silicon layer 27 is selectively formed only at the portion in which the semiconductor substrate 21 is exposed, through low-pressure chemical vapor deposition (LPCVD) or high vacuum chemical vapor deposition (UHVCVD). The doping is performed by flowing phospine having the amount of 50~300 sccm.

In case of low pressure chemical vapor deposition method, before the doped epitaxial silicon layer 27 is formed, it is hydrogen baked at the temperature of 800~900° C. for 1~5 minutes. As this is performed for the purpose of preventing from forming any oxide film at the surface of the semiconductor substrate 21, in-situ must be performed within the apparatus. The deposition conditions for the doped epitaxial silicon layer 27 are as follows: a combination gas of DCS and HCL is used as a deposition gas; upon deposition DCS is flowed at 30~300 sccm and HCL is flowed at 30~200 sccm; the deposition pressure is about 10~50 torr; and the deposition temperature is about 750~950° C. At this time, the deposition time is about 3~10 minutes.

In case of high vacuum chemical vapor deposition, silane or disilane is used as a deposition gas; the deposition pressure is less than 1 torr; and the deposition temperature is about 600~700° C.

Figure 2D:
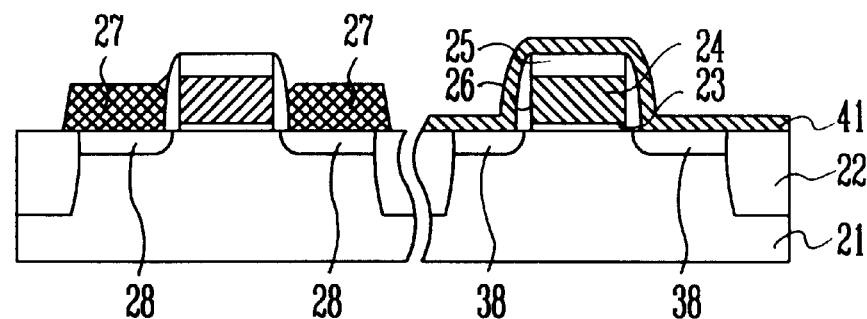

Referring to FIG. 2d, after a source/drain ion implantation process is performed to the peripheral circuit area P covered with the nitride film 41, a thermal processing process is performed for activating the ion implanted dopants. During thermal processing process, the dopants are diffused into the semiconductor substrate 21 by means of ion implantation process to form a general source/drain junction 38 at the peripheral circuit area P. On the other hand, the dopants within the doped epitaxial silicon layer 27 are diffused into the semiconductor substrate 21 to form an elevated source/drain junction 28 at the cell area C.

In the above, the conditions for source/drain ion implantation are as follows; in case of P+ source/drain, $^{11}B^+$ or $BF_2^+$ is used as dopants, ions are injected with 5~50 keV in case of $^{11}B^+$ ion and with 10~100 keV in case of $BF_2^+$ ion, and the amount of injection is $1\times10^{15}$~$1\times10^{17}$ ions/cm². In case of N+ source/drain, however, $As^+$ or $P^+$ is used as dopants, ions are injected with 10~100 keV in case of $As^+$ ion and with 10~70 keV in case of $P^+$ ion; the amount of ion injection is $1\times10^{15}$~$1\times10^{17}$ ions/cm²; At this time, the thermal process for activating the dopants uses a rapid thermal process (RTP) at the temperature of 800~1000° C. less than 30 seconds.

Figure 2E:
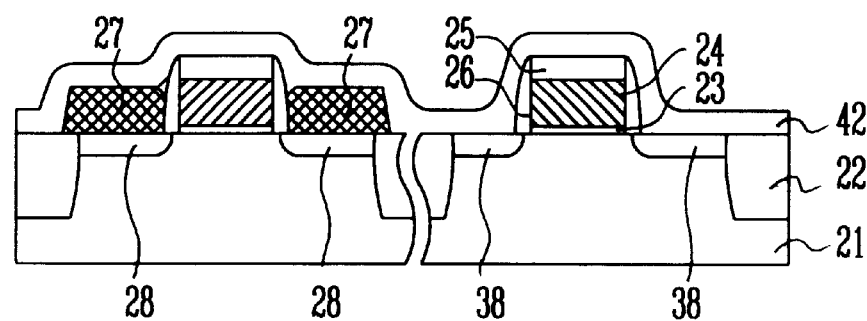

Finally, referring to FIG. 2e, after the nitride film 41 remaining at the peripheral circuit area P is removed, an interlayer insulation film 42 is formed on the entire structure.

In the above, the nitride film 41 is removed under hot $H_3PO_4$ conditions using wet etching method.

More particularly, the present invention relates to a method of forming a junction region in a semiconductor device which can improve the characteristic of the device junction both at the source/drain regions and also can increase the transistor characteristic of the semiconductor device, in a way that an elevated source/drain junction is applied only to the cell area, in applying the elevated source/drain junction using the selective epitaxial technology to the device as the integration degree of the semiconductor device increases, and source/drain ion implantation process and thermal process are performed with a nitride film being capped at a peripheral area.

As can be understood from the above description with the present invention, the present invention can reduce a contact resistance while obtaining a contact margin due to flattened gate upon a subsequent process of forming a contact by applying a doped elevated source/drain junction only to the cell area. Also it can prevent a metal contamination by performing a source/drain ion implantation process and thermal processing process with a nitride film being capped at the peripheral circuit area; and also reduce the junction depth by lowering diffusion of dopants that is suppressed under a high compressive stress. Thus, the present invention can improve the junction characteristic of the transistor both at the cell and peripheral circuit areas.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A method of forming a junction region in a semiconductor device, comprising the steps of:

forming gate electrodes at a cell area and a peripheral circuit area, respectively, which are defined in a semiconductor substrate;

forming gate spacers at side walls of each of the gate electrodes and forming a nitride film only at said peripheral circuit area;

selectively forming a doped epitaxial silicon layer on said semiconductor substrate in the cell area;

performing source/drain implantation process to the peripheral circuit area covered with the nitride film and then performing thermal process for activating ion implanted dopants to forming a source/drain junction only at the peripheral circuit area, so that, during the thermal processing process, the dopants within said doped epitaxial silicon layer are diffused to form an elevated source/drain junction at the cell area; and removing any nitride film remaining at said peripheral circuit area to form an interlayer insulation film.

2. The method of forming a junction region in a semiconductor device according to claim 1, wherein said gate spacer is formed of an oxide film having the thickness of the 300~800 Å.

3. The method of forming a junction region in a semiconductor device according to claim 1, wherein said nitride film is deposited in thickness of 300~800 Å using low pressure chemical vapor deposition method.

4. The method of forming a junction region in a semiconductor device according to claim 1, wherein said doped epitaxial silicon layer is selectively formed in thickness of 500~800 Å only at the portion in which said semiconductor substrate is exposed, through low-pressure chemical vapor deposition method or high vacuum chemical vapor deposition method, and doped by flowing phospine having the amount of 50~300 sccm.

5. The method of forming a junction region in a semiconductor device according to claim 1, further comprising cleaning process for removing oxide film formed on said semiconductor device using RCA cleaning, UV ozone cleaning, HF dipping or combination of these before said doped epitaxial silicon layer is formed.

6. The method of forming a junction region in a semiconductor device according to claim 1, wherein said doped epitaxial silicon layer is formed by performing hydrogen baking at the temperature, of 800~900° C. for 1~5 minutes and then by performing a low pressure vapor deposition method under the condition having the combination gas of DCS of 30~300 sccm and HCL of 30~200 sccm, having the pressure of 10~50 torr and having the temperature of 750~950° C., for 3~10 minutes.

7. The method of forming a junction region in a semiconductor device according to claim 1, wherein in case that said doped epitaxial silicon layer is formed by high vacuum chemical vapor deposition, the deposition gas thereof is silane or disilane; the deposition pressure thereof is less than 1 torr; and the deposition temperatute thereof is about 600~700° C.

8. The method of forming a junction region in a semiconductor device according to claim 1, wherein said conditions is as follows; in case of $P^+$ source/drain, the source/drain ion implantation use $^{11}B^+$ or $BF_2^+$ as dopants, ions are injected with 5~50 keV in case of $^{11}B^+$ ion and with 10~100 keV in case of $BF_2^+$ ion, and the amount of injection is $1\times10^{15}$~$1\times10^{17}$ ions/cm$^2$; and in case of $N^+$ source/drain, the source/drain ion implantation use $As^+$ or $P^+$ is used as dopants, ions are injected with 10~100 keV in case of $As^+$ ion and with 10~70 keV in case of $P^+$ ion, the amount of ion injection is $1\times10^{15}$~$1\times10^{17}$ ions/cm$^2$.

9. The method of forming a junction region in a semiconductor device according to claim 1, wherein said thermal processing is a rapid thermal process less than 30 seconds at the temperature of 800~1000° C.

10. The method of forming a junction region in a semiconductor device according to claim 1, wherein said nitride film is removed by wet etching method under hot $H_3PO_4$.

11. A method of forming a junction region in semiconductor device, comprising the steps of:

forming gate electrode at a cell area and a peripheral circuit area, respectively, which are defined in a semiconductor substrate;

forming a gate spacers at side walls of each of the gate electrodes and forming a nitride film only at said peripheral circuit area;

selectively forming a doped epitaxial silicon layer on said semiconductor substrate in the cell area;

performing a source/drain implantation process to said peripheral circuit area covered with the nitride film;

performing a thermal process so that ion implanted dopants within said silicon substrate at said peripheral circuit area are activated to form a source/drain junction at said peripheral circuit area, and dopants within said doped epitaxial silicon layer are diffused into said silicon substrate at said cell area to form an elevated source/drain junction at said cell area; and removing any nitride film remaining at said peripheral circuit area to form an interlayer insulation film.

12. A method of simultaneously forming at least one junction region in both a cell area and a peripheral area of a semiconductor device, the method comprising the steps of:

forming, on a semiconductor substrate, a first gate electrode at a cell area and a second gate electrode at a peripheral circuit area;

forming gate spacers at side walls of the first and second gate electrodes;

forming a nitride film at said peripheral circuit area;

forming a doped epitaxial silicon layer on said semiconductor substrate only in the cell area;

performing a source/drain ion implantation process through the nitride film at said peripheral circuit area; and performing a thermal process to thereby simultaneously:
(i) activate ion implanted dopants in the peripheral circuit area to thereby form a first source/drain junction in the peripheral circuit area; and
(ii) diffuse dopants within the doped epitaxial silicon layer into the substrate to form an elevated source/drain junction at the cell area;

removing at least some of the nitride film previously formed at said peripheral circuit area, after the step of performing a thermal process; and forming an interlayer insulation film on both the cell area and the peripheral circuit area.

13. The method according to claim 12, wherein the step of forming a nitride film at said peripheral circuit area comprises:

forming a nitride film at the cell area and also at the peripheral circuit area; and removing the nitride film at the cell area.

* * * * *